(12) United States Patent
Nomura

(10) Patent No.: US 7,365,397 B2
(45) Date of Patent: Apr. 29, 2008

(54) SEMICONDUCTOR DEVICE

(75) Inventor: Hiroshi Nomura, Kawasaki (JP)

(73) Assignee: Fujitsu Limited, Kawaski (JP)

(*) Notice: Subject to any disclaimer, the term of this patent is extended or adjusted under 35 U.S.C. 154(b) by 0 days.

(21) Appl. No.: 11/261,794

(22) Filed: Oct. 31, 2005

(65) Prior Publication Data
US 2006/0049484 A1 Mar. 9, 2006

Related U.S. Application Data

(63) Continuation of application No. PCT/JP03/09725, filed on Jul. 31, 2003.

(51) Int. Cl.
*H01L 23/62* (2006.01)

(52) U.S. Cl. .................. 257/359; 257/358; 257/379; 257/380; 257/581

(58) Field of Classification Search ........... 257/359, 257/358, 379, 380, 581
See application file for complete search history.

(56) References Cited

U.S. PATENT DOCUMENTS

| 5,510,642 A | 4/1996 | Ogawa |
| 6,958,523 B2 * | 10/2005 | Babcock et al. ........... 257/538 |

FOREIGN PATENT DOCUMENTS

| JP | 61-43464 | 3/1986 |
| JP | 2-283058 | 11/1990 |
| JP | 3-171657 | 7/1991 |
| JP | 03-171657 A | 7/1991 |
| JP | 3-248458 | 11/1991 |
| JP | 5-13565 | 1/1993 |
| JP | 7-106511 | 4/1995 |
| JP | 7-142677 | 6/1995 |
| JP | 07-142677 A | 6/1995 |
| JP | 2001-257317 | 9/2001 |

OTHER PUBLICATIONS

Korean Office Action dated Dec. 13, 2006, issued in Korean Application No. 10-2005-7022558.
Chinese Office Action dated Sep. 21, 2007, issued in Chinese Application No. 038265532.

* cited by examiner

*Primary Examiner*—Evan Pert
*Assistant Examiner*—Tan Tran
(74) *Attorney, Agent, or Firm*—Westerman, Hattori, Daniels & Adrian, LLP.

(57) ABSTRACT

The semiconductor device comprises a resistance element 26 formed of polysilicon film formed on a silicon substrate 10, which includes a resistor part 26a having a resistance value set at a prescribed value, contact parts 26b formed on both sides of the resistor part 26a and connected to a line for applying a fixed potential, and a heat radiation part 26c connected to the contact part 26b, whereby the semiconductor device can include the resistance element having a small parasitic capacitance and good heat radiation.

20 Claims, 15 Drawing Sheets

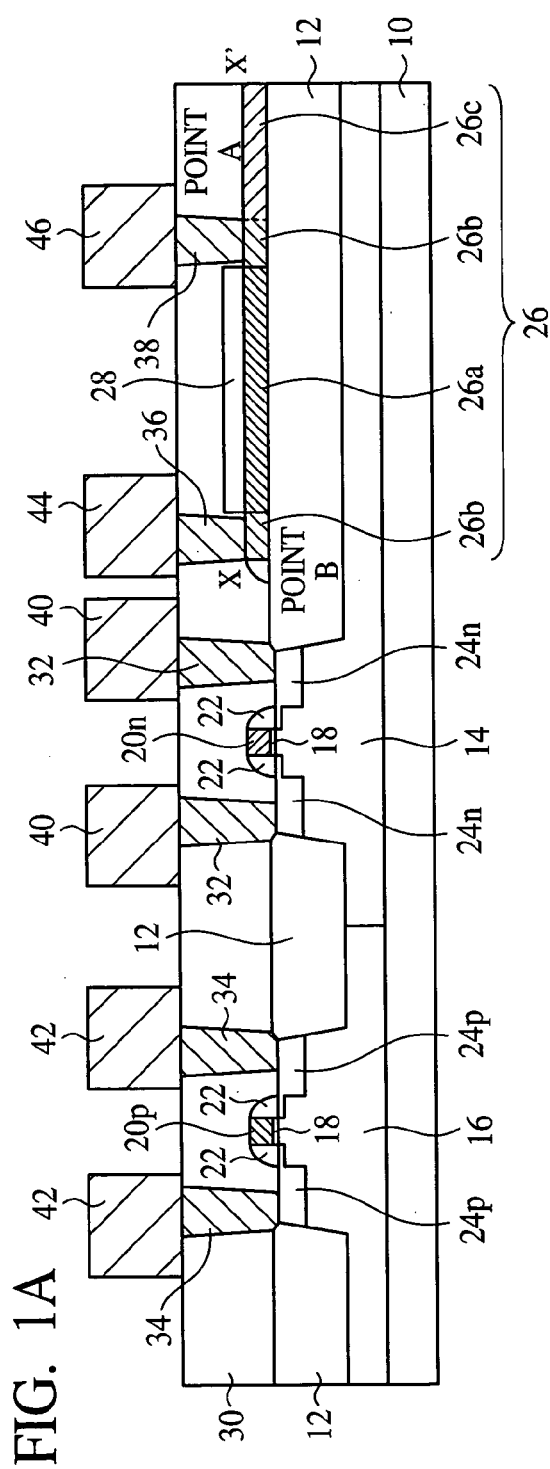
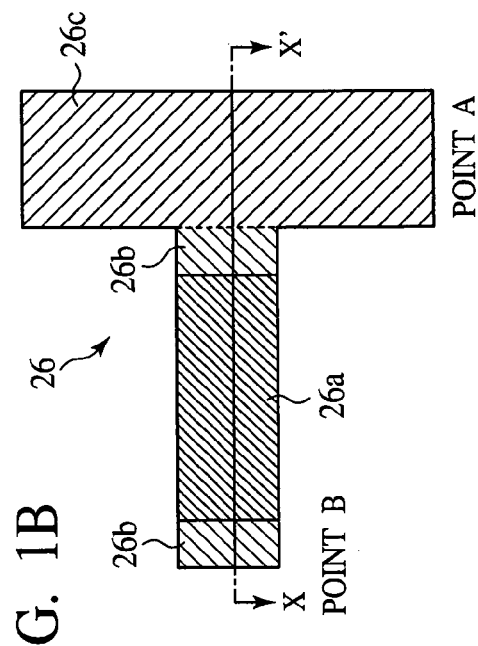
FIG. 1A
FIG. 1B

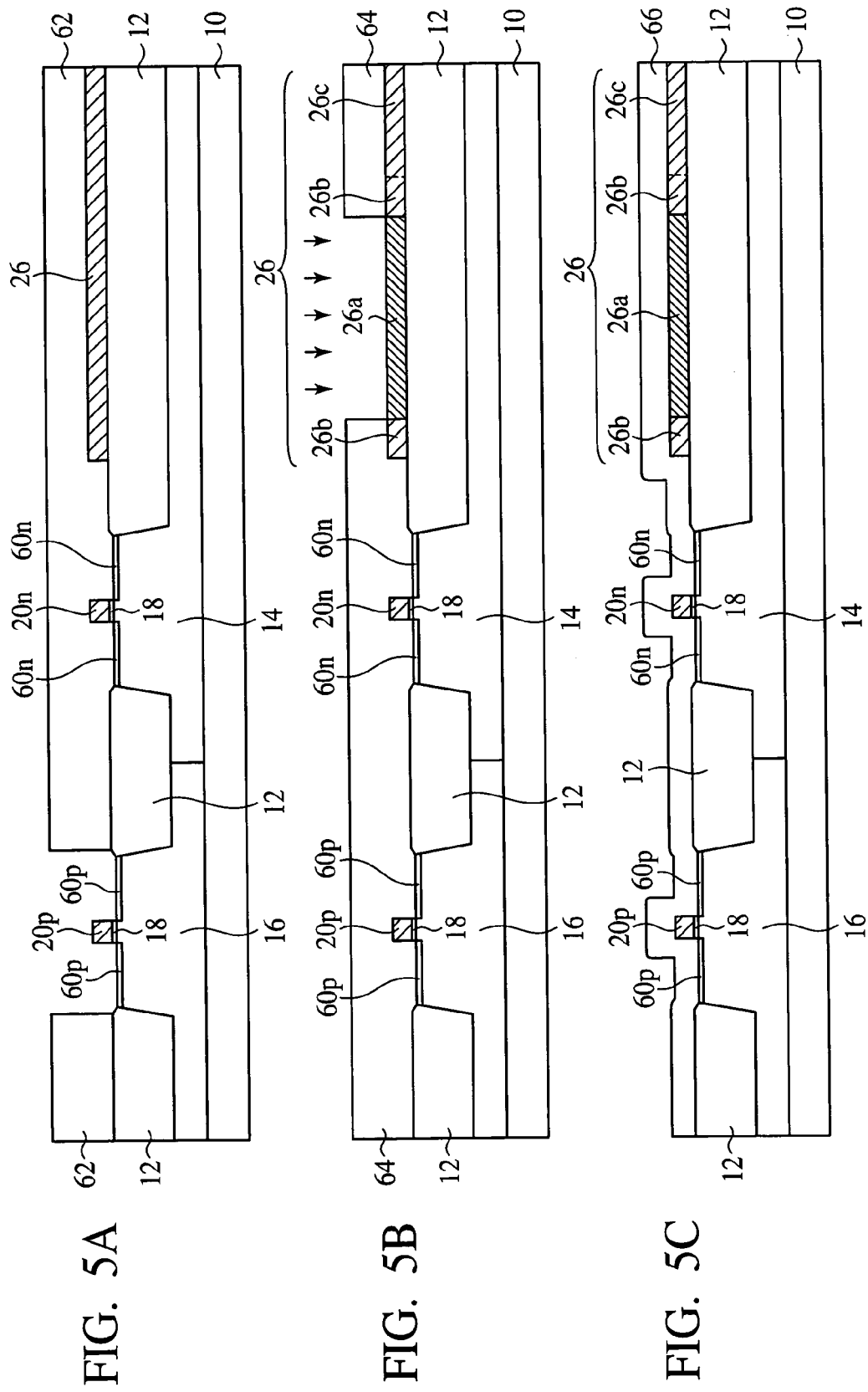

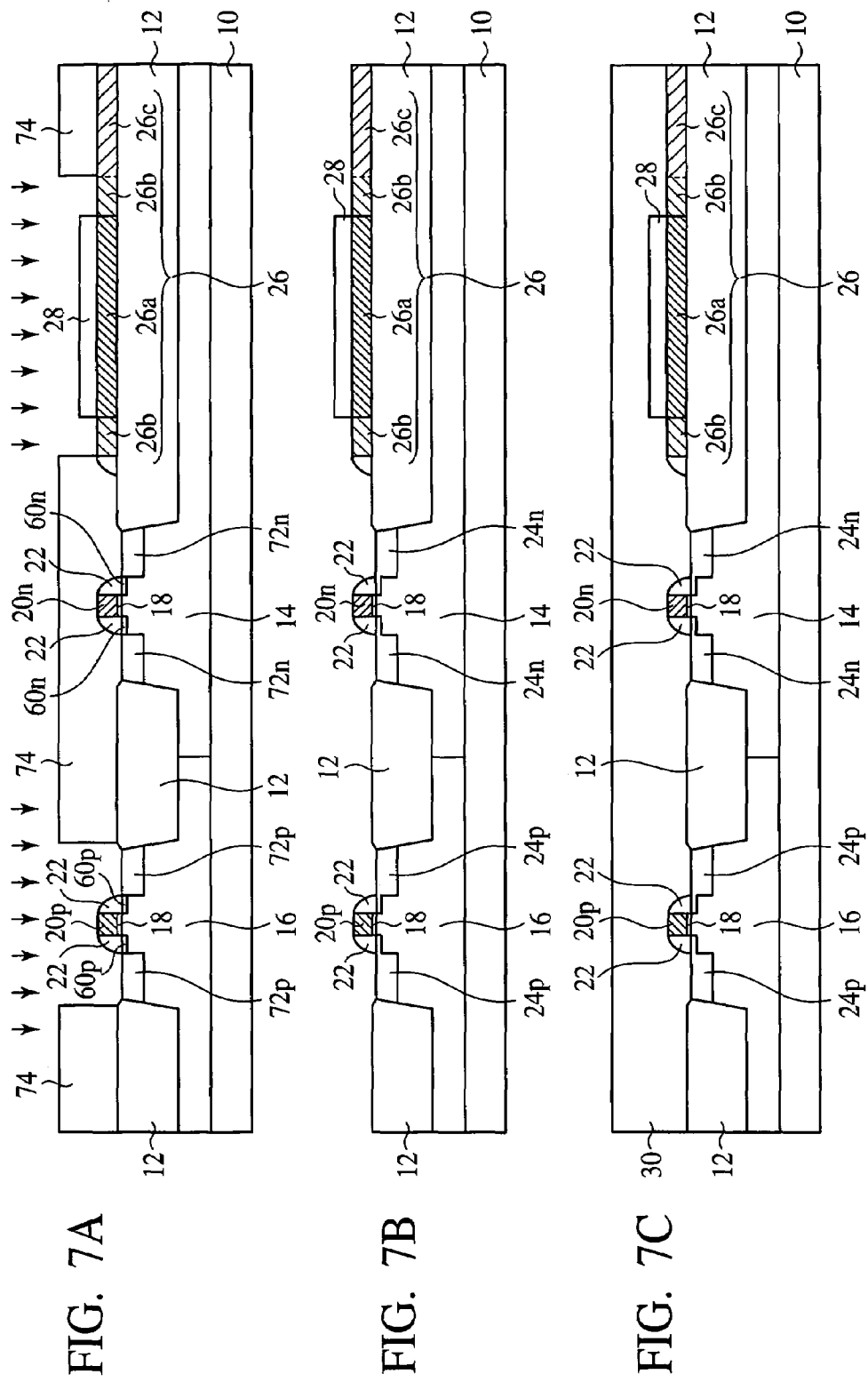

US 7,365,397 B2

SEMICONDUCTOR DEVICE

CROSS REFERENCE TO RELATED APPLICATIONS

This application is a Continuation of International Application No. PCT/JP03/09725, with an international filing date of Jul. 31, 2003, which designated the United States of America.

TECHNICAL FIELD

The present invention relates to a semiconductor device, more specifically a semiconductor device including a resistance element of polysilicon film.

BACKGROUND ART

As a resistance element incorporated in a semiconductor device, presently a resistance element of polysilicon film is predominantly used. This is because of merits of the good compatibility of the step of forming the resistance element of polysilicon film with the rest process for fabricating the semiconductor device, and the low bias dependency of the resistance element of polysilicon.

Generally, a polysilicon film forming the resistance element is formed concurrently with that forming the gate electrode of a transistor. Accordingly, the resistance element of polysilicon film is formed on the device isolation insulation film defining a device region on the semiconductor substrate or on the gate insulation film. In view of the capacitance with respect to the substrate and the insulation with respect to the substrate, the resistance element is formed mostly on the device isolation insulation film rather than on the gate insulation film.

FIG. 15 is a sectional view of a semiconductor device including a CMOS transistor and a resistance element of polysilicon film, which illustrates a structure thereof.

As illustrated, a device isolation insulation film 102 defining a device region is formed on a silicon substrate 100.

A P well 104 is formed in the silicon substrate 100 in a region for an N type MOS transistor formed in. An N well 106 is formed in the silicon substrate 100 in a region for a P type MOS transistor formed in.

A gate electrode 110n of polysilicon film is formed on the silicon substrate 100 in the region for the N type MOS transistor formed in with a gate insulation film 108 formed therebetween. A sidewall spacer 112 is formed on the side wall of the gate electrode 110n. Source/drain diffused layers 114n of the extension source/drain structure are formed in the silicon substrate 110 on both sides of the gate electrode 110n. Thus, the N type MOS transistor including the gate electrode 110n and the source/drain diffused layers 114n is formed in the region for the N type MOS transistor formed in.

A gate electrode 110p of polysilicon film is formed on the silicon substrate 100 in a region for a P type MOS transistor formed in with the gate insulation film 108 formed therebetween. A sidewall spacer 112 is formed on the side wall of the gate electrode 110p. Source/drain diffused layers 114p of the extension source/drain structure are formed in the silicon substrate 100 on both sides of the gate electrode 110p. Thus, the P type MOS transistor including the gate electrode 110p and the source/drain diffused layers 114p is formed in the region for the P type MOS transistor formed in.

On the device isolation insulation film 102 in a region for a resistance element formed in, a resistance element 116 of polysilicon film with an impurity implanted in is formed. An insulation film 118 is formed on the resistance element 116. The insulation film is not formed in contact parts on both sides of the resistance element 116.

An inter-layer insulation film 120 is formed on the silicon substrate 100 with the N type MOS transistor, the P type MOS transistor and the resistance element 116 formed on. In the inter-layer insulation film 120, there are buried contact plugs 122, 124 electrically connected respectively to the source/drain diffused layers 114n, 114p, contact plugs (not illustrated) electrically connected respectively to the gate electrodes 110n, 110p, and contact plugs 126, 128 connected respectively to the contact parts on both sides of the resistance element 116.

On the inter-layer insulation film 120 with the contact plugs 122–126 buried in, there are formed interconnection layers 130, 132 electrically connected respectively to the source/drain diffused layer 114n, 114p via the contact plugs 122, 124, interconnection layers (not illustrated) electrically connected respectively to the gate electrodes 110n, 110p via the contact plugs, interconnection layers 134, 136 electrically connected respectively to the contact parts on both sides of the resistance element 116 via the contact plugs 126, 128.

Thus, the semiconductor device including the CMOS transistor and the resistance element of polysilicon film is constituted.

In the resistance element incorporated in the semiconductor device as described above, current flows, and electric power is consumed to thereby generate Joule heat. In the semiconductor device having the resistance element formed on the device isolation insulation film as illustrated in FIG. 15, the Joule heat generated in the resistance element escapes mainly into the semiconductor substrate via the device isolation insulation film formed below the resistance element. Accordingly, as the area of the resistance element is larger, the Joule heat generated in the resistance element can escape more easily, and demerits of the resistivity decrease due to the heat generation and the breakage of the resistance element due to the resultant current increase due to the resistivity decrease can be surely prevented.

On the other hand, as the area of the resistance element is smaller, the parasitic capacitance generated between the resistance element and the semiconductor substrate becomes smaller.

As described above, the area of the resistance element must be large so as to ensure the heat radiation of the resistance element while the area of the resistance element must be small so as to decrease the parasitic capacitance. Thus, it is very difficult to make the heat radiation of the resistance element and the parasitic capacitance decrease compatible with each other.

As techniques of ensuring the heat radiation of the resistance element of polysilicon film while decreasing the parasitic capacitance, the techniques disclosed in, e.g., Japanese published unexamined patent application No. Hei 2-283058 (Patent Reference 1), Japanese published unexamined patent application No. Hei 3-248458 (Patent reference 2), Japanese published unexamined patent application No. 2000-150780 (Patent Reference 3) and Japanese published unexamined patent application No. 2001-257317 (Patent Reference 4) are known.

Patent References 1 and 2 disclose the constitution for contacting the resistance element of polysilicon film to the semiconductor substrate outside the contact parts to thereby release the heat generated in the resistance element directly into the substrate. In this constitution, because of the resistance element contacting the substrate, high heat radiation effect can be produced.

Patent Reference 3 discloses the constitution that a polysilicon film of high specific resistance is formed between the resistance element of polysilicon film and the substrate with an insulation film formed therebetween. This constitution, in which the resistance element is in contact with the polysilicon film of high specific resistance and high heat conductivity with the thin insulation film therebetween, allows the heat generated in the resistance element to efficiently escape into the substrate. Since the polysilicon film below the resistance element is thick enough to space the resistance element and the substrate from each other by the thickness of the polysilicon film, the parasitic capacitance is small.

Patent Reference 4 discloses the constitution that the resistance element is extended not only on the thin insulation film but also on the thick insulation film. In this constitution, the heat radiation path to the substrate is ensured via the thick insulation film and also via the protection film formed on the resistance element, which makes it unnecessary to increase the area of the thin insulation film, and no large parasitic capacitance is caused.

However, the constitutions of the semiconductor devices including the resistance elements of polysilcon film disclosed in Patent References 1 to 4 have the following disadvantages which will be described below.

For example, in the constitutions disclosed in Patent References 1 and 2, the potential of the part where the resistance element and the substrate contact with each other must be controlled. In applying this constitution to, e.g., the CMOS circuit, after the gate oxide film has been formed, a contact window for contacting the resistance element and the substrate to each other is opened in the oxide film. It will be necessary to consider the influence of the process of etching, etc. for opening the gate oxide film on the reliability of the gate oxide film.

In applying the constitution disclosed in Patent Reference 3 especially to the CMOS circuit, it is necessary to lay two polysilicon films and pattern for the respective polysilicon films, which will make the steps complicated and increase the fabrication cost.

In the constitution disclosed in Patent Reference 4, in which the resistance element is extended also on the thick insulation film, it is unnecessary to increase the area of the thin insulation film on which the resistance element is formed, but the parasitic capacitance generated in the region for the thin insulation film formed in will not be negligible.

An object of the present invention is to provide a semiconductor device including a resistance element having small parasitic capacitance and good heat radiation.

DISCLOSURE OF INVENTION

According to one aspect of the present invention, there is provided a semiconductor device comprising a resistance element of a polysilicon film formed over a semiconductor substrate, the resistance element including a resistor part having a resistance value set at a prescribed value, a contact part formed on an end of the resistor part and connected to a line for applying a fixed potential, and a heat radiation part connected to the contact part.

According to the present invention, the resistance element of a polysilicon film, which is formed over the semiconductor substrate, has the resistor part whose resistance value set at a prescribed value, the contact part formed on the side of the resistor part and connected to the line for applying a fixed potential, and the heat radiation part connected to the contact part, whereby the semiconductor device including the resistance element having a small parasitic capacitance and good heat radiation can be provided.

BRIEF DESCRIPTION OF DRAWINGS

FIGS. 1A and 1B are diagrammatic views of the semiconductor device according to the present invention, which illustrate a structure thereof.

FIGS. 5A–5C are sectional views of the semiconductor device according to the first embodiment of the present invention in the step of the method for fabricating the same, which illustrate the method (Part 3).

FIGS. 7A–7C are sectional views of the semiconductor device according to the first embodiment of the present invention in the step of the method for fabricating the same, which illustrate the method (Part 5).

BEST MODE FOR CARRYING OUT THE INVENTION (A First Embodiment)

Figure 2:
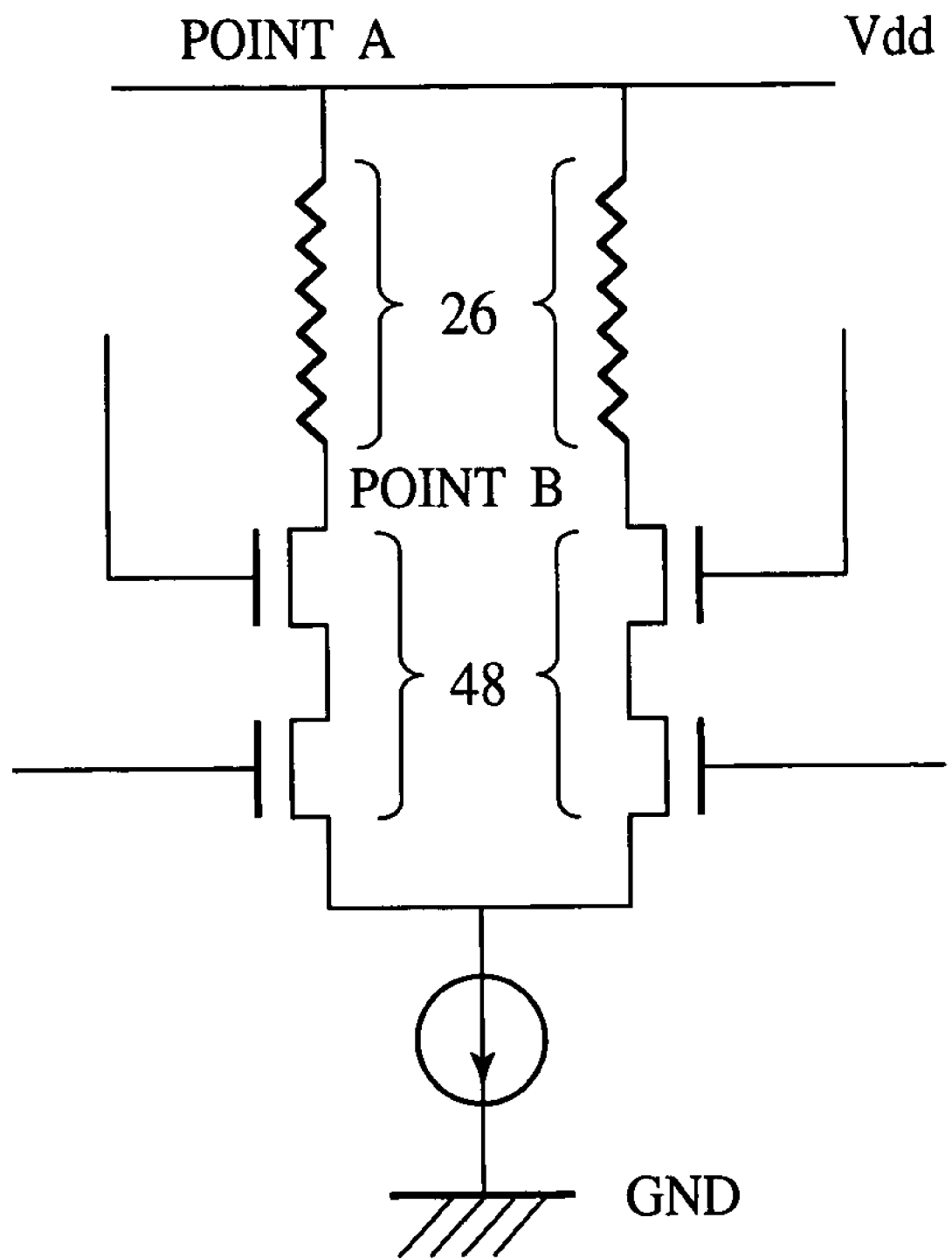
FIG. 2 is a circuit diagram of a differential pair circuit comprising the semiconductor devices according to the first embodiment of the present invention.

The semiconductor device and the method for fabricating the same according to a first embodiment of the present invention will be explained with reference to FIGS. 1A to 8B. FIGS. 1A and 1B are diagrammatic views of the semiconductor device according to the present embodiment, which illustrates a structure thereof. FIG. 2 is a circuit diagram of the differential pair circuit comprising the semiconductor devices according to the present embodiment. FIGS. 3A to 8B are sectional views of the semiconductor device according to the present embodiment in the steps of the method for fabricating the same, which illustrate the method.

First, the structure of the semiconductor device according to the present embodiment will be explained with reference to FIGS. 1A, 1B and 2. FIG. 1A is a sectional view of the semiconductor device according to the present embodiment, which illustrates the structure thereof. FIG. 1B is a plan view of the resistance element of the semiconductor device according to the present embodiment, which illustrates the structure thereof. The section of the resistance element illustrated in FIG. 1A corresponds to the section along the line X–X' in FIG. 1B.

As illustrated in FIG. 1A, a device isolation insulation film 12 is formed on a silicon substrate 10. A P well 14 is formed in the silicon substrate 10 in a region for an N type MOS transistor formed in. An N well 16 is formed in the silicon substrate 10 in a region for a P type MOS transistor formed in.

A gate electrode 20n of polysilicon film is formed on the silicon substrate 10 in the region for the N type MOS transistor formed in with a gate insulation film 18 formed therebetween. A sidewall spacer 22 is formed on the side wall of the gate electrode 20n. Source/drain diffused layers 24n of the extension source/drain structure are formed in the silicon substrate 10 on both sides of the gate electrode 20n. Thus, in the region for the N type MOS transistor formed in, the N type MOS transistor including the gate electrode 22n and the source/drain diffused layers 24n is fabricated.

A gate electrode 20p of polysilicon film is formed on the silicon substrate 10 in the region for the P type MOS transistor formed in with a gate insulation film 18 formed therebetween. A sidewall spacer 22 is formed on the side wall of the gate electrode 20p. Source/drain diffused layers 24p of the extension source/drain structure are formed in the silicon substrate 10 on both sides of the gate electrode 20p. Thus, in the region for the P type MOS transistor formed in, the P type MOS transistor including the gate electrode 22p and the source/drain diffused layers 24p is fabricated.

A resistance element 26 of polysilicon film is formed on the device isolation insulation film 12 in a region for a resistance element formed in. As illustrated in FIGS. 1A and 1B, the resistance element 26 includes a resistor part 26a, contact parts 26b formed on both sides of the resistor part 26a, and a heat radiation part 26c connected to one contact portion 26b. The resistor part 26a functions as a resistor formed of polysilicon film in a rectangular shape and having an impurity implanted to have a required resistance value. The contact parts 26b is formed of polysilicon film with an impurity heavily implanted and connected to contact plugs. The heat radiation part 26c is formed of polysilicon film in a plane shape which is wider than the resistor part 26a and the contact parts 26b and has a larger area than the resistor part 26a and the contact parts 26b. For example, the resistor part 26a and the contact parts 26b on both sides of the resistor part 26a have, as illustrated in FIG. 1B, a rectangular plane shape of substantially the same width, and the heat radiation part 26c has a rectangular shape wider than the resistor part 26a and the contact parts 26b. The resistor part 26a, the contact parts 26b and the heat radiation part 26c are formed integral by patterning one and the same polysilicon film.

An insulation film 28 is formed on the resistor part 26a of the resistance element 26.

An inter-layer insulation film 30 is formed on the silicon substrate 10 with the N type MOS transistor, the P type MOS transistor and the resistance element 26 formed on. In the inter-layer insulation film 30, there are buried contact plugs 32, 34 electrically connected respectively to the source/drain diffused layers 24n, 24p, contact plugs (not illustrated) electrically connected respectively to the gate electrodes 20n, 20p and contact plugs 36, 38 electrically connected respectively to the contact parts 26b of the resistance element 26 on both sides of the resistor part 26a.

On the inter-layer insulation film 30 with the contact plugs 32–38 buried in, there are formed an interconnection layers 40, 42 electrically connected respectively to the source/drain diffused layers 24n, 24p via the contact plugs 32, 34, interconnection layers (not illustrated) electrically connected respectively to the gate electrodes 20n, 20p via the contact plugs, interconnection layers 44, 46 electrically connected respectively to the contact parts 26b of the resistance element 26 via the contact plugs 36, 38.

Thus, the semiconductor device according to the present embodiment is constituted.

FIG. 2 is the circuit diagram of a differential pair circuit according to one example of the circuit including the semiconductor devices according to the present embodiment. As illustrated, circuits each including the CMOS transistor 48 and the resistance element 26 connected in series formed of the semiconductor device according to the present embodiment are connected in parallel. The heat radiation part 26c of each resistance element 26 is connected at the point A to a source voltage (Vdd) which is a fixed potential. That is, the contact part 26b of each resistance element 26, which is in contact with the heat radiation part 26c, is connected to the power source line which applies the source voltage (Vdd) to the differential pair circuit. One of the source/drain of each CMOS transistor 48, which is electrically connected at the point B to the resistor part 26a of the resistance element 26, is connected to the ground potential line.

The semiconductor device according to the present embodiment is characterized mainly in that the resistance element 26 has the heat radiation part 26c of high heat radiation whose area is larger in comparison with that of the resistor part 26a, which functions as the resistor, provided at a part where the parasitic capacitance presence is not disadvantageous to the circuit constitution, as is in the contact part 26b, which is connected to the line for applying the fixed potential.

The characteristics of the semiconductor device according to the present embodiment will be explained by means of the differential pair circuit as illustrated in FIG. 2, which comprises the semiconductor devices according to the present embodiment.

In the differential pair circuit including the semiconductor devices according to the present embodiment, as illustrated in FIG. 2, the point A of each resistance element 26, which is a load resistance of the differential pair circuit, is connected to the power source voltage, and the voltage at the point A never varies independent of the operation of the circuit. Accordingly, even with a parasitic capacitance being present at the point A, where the charge and discharge do not take place in the operation of the circuit, no disadvantage due to the parasitic capacitance presence takes place in terms of the circuit constitution.

Accordingly, the heat radiation part 26c of polysilicon film, which has high heat radiation and a larger area in comparison with the resistor part 26a which functions as the resistor, is provided at the part where the heat radiation part 26c cause no disadvantage even with a parasitic capacitance being present, whereby the Joule heat generated in the resistor part 26a can effectively escape to the silicon substrate 10 through the heat radiation part 26c, and good heat radiation can be ensured.

On the other hand, the point B of the resistance element 26 and the resistor part 26a have the potential varied by the operations of the circuit, such as the on/off operation of the transistors, etc. Accordingly, when a parasitic capacitance is present at such parts, charge and discharge are made, causing, in terms of the circuit constitution, disadvantages of delays in the circuit operation, etc. The resistor part 26a may be designed to have the polysilicon film narrowed to thereby have a small area and decrease the parasitic capacitance as much as possible. Here, the radiation of the Joule heat generated in the resistor part 26a is ensured by the heat radiation part 26c, and the resistor part 26a can be designed from the viewpoint of decreasing the parasitic capacitance without being restricted by ensuring the radiation of the Joule heat.

The point A of the resistance element 26 is connected to the power source voltage of the differential pair circuit in FIG. 2 but is not connected essentially to the power source voltage. The point A may be connected to any potential as long as the potential is a fixed potential. The point A may be connected to, e.g., ground potential.

As described above, the semiconductor device according to the present embodiment comprises the resistance element 26 which includes the heat radiation part 26c of high heat radiation formed of polysilicon film having a larger area than the resistor part 26a functioning as the resistor, at the part, such as the contact part 26b connected to the line for applying the fixed potential, which causes no disadvantage in terms of the circuit constitution, and which includes the resistor part 26a designed from the viewpoint of decreasing the parasitic capacitance without being restricted by ensuring the radiation of the Joule heat, whereby the semiconductor device comprising the resistance element whose parasitic capacitance, which causes disadvantages in terms of the circuit constitution, is small, and which has good radiation of the generated Joule heat can be provided.

Next, the method for fabricating the semiconductor device according to the present embodiment will be explained with reference to FIGS. 3A to 8B.

Figure 3A:
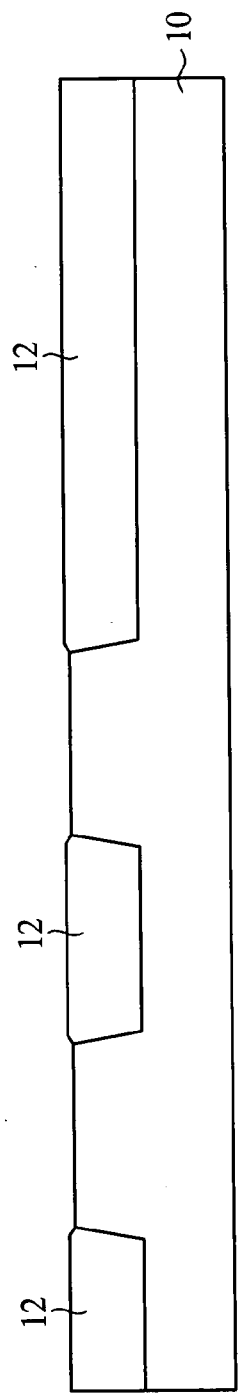
FIGS. 3A–3C are sectional views of the semiconductor device according to the first embodiment of the present invention in the step of the method for fabricating the same, which illustrate the method (Part 1).

First, a device isolation insulation film 12 for defining device regions is formed on a p type silicon substrate 10 by, e.g., STI (Shallow Trench Isolation) (see FIG. 3A). The impurity concentration of the p-type silicon substrate 10 is, e.g., $1\times10^{15}$–$1\times10^{16}$/cm$^3$. In FIGS. 3A to 8B, the device region on the left side of the device isolation film 12 at the center as viewed in FIGS. 3A to 8B is a region for a P type MOS transistor to be formed in, and the device region on the right side as viewed in FIGS. 3A to 8B is a region for an N type MOS transistor to be formed in. A region for the resistance element to be formed in is on the device isolation insulation film 12 on the right side as viewed in FIGS. 3A to 8B.

Figure 3B:
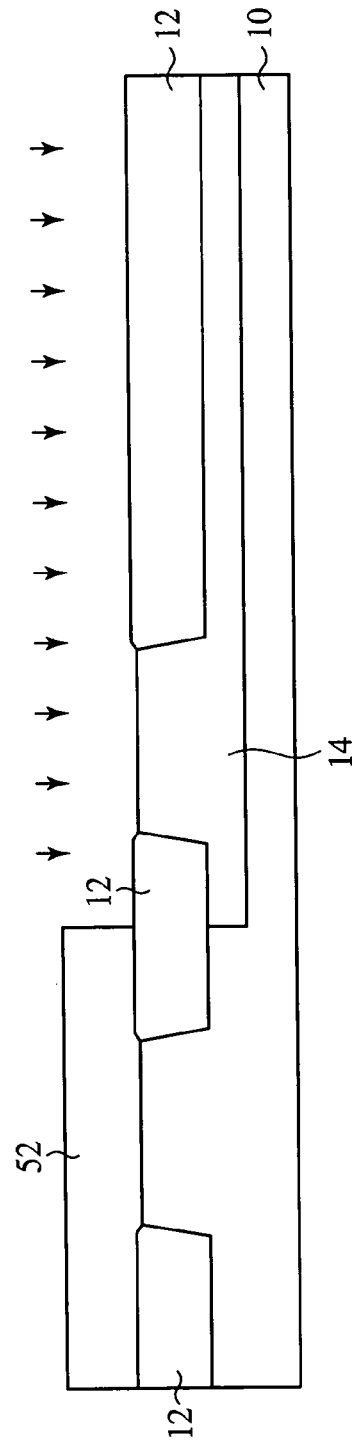

Then, a resist film 52 having an opening for exposing the region for the N type MOS transistor to be formed in is formed, and by ion implantation using the resist film 52 as the mask, the P well 14 is formed in the region for the N type MOS transistor to be formed in (see FIG. 3B). After the P well 14 has been formed, the resist film 52 used as the mask is removed.

Figure 3C:
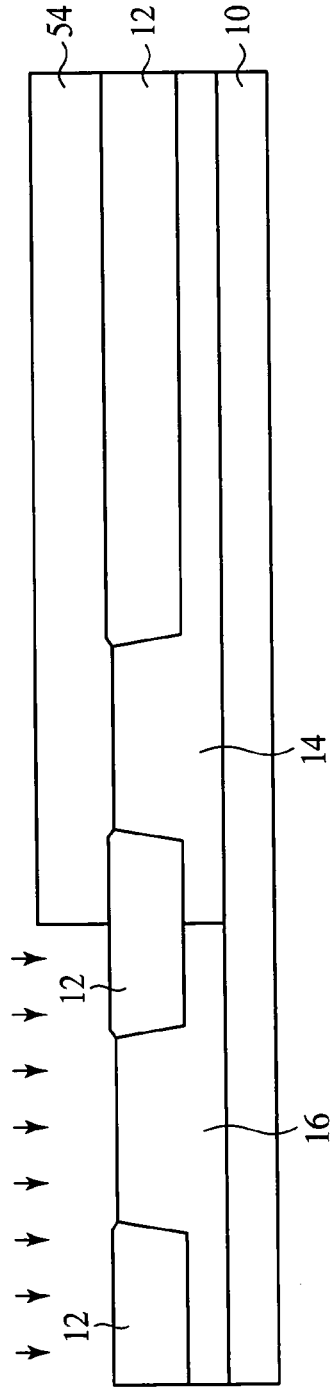

Similarly, a resist film 54 having an opening for exposing the region for the P type MOS transistor to be formed in is formed, and by ion implantation using the resist film 54 as the mask, the N well 16 is formed in the region for the P type MOS transistor to be formed in (see FIG. 3C). After the N well 16 has been formed, the resist film 54 used as the mask is removed.

The impurity concentrations of the P well 14 and the N well 16 are both, e.g., $1\times10^{17}$–$1\times10^{18}$/cm$^3$.

Then, the surface of the silicon substrate 10 is thermally oxidized by, e.g., thermal oxidation, and the gate insulation film 18 of silicon oxide film is formed on the device regions. The gate insulation film 18 may be formed of silicon oxynitride film, alumina film, ferroelectric film or other insulation films.

Figure 4A:
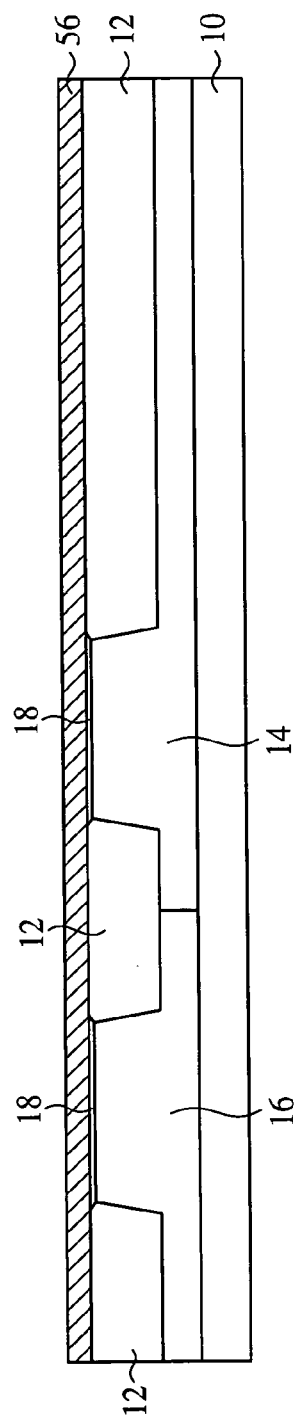
FIGS. 4A–4C are sectional views of the semiconductor device according to the first embodiment of the present invention in the step of the method for fabricating the same, which illustrate the method (Part 2).

Then, a polysilicon film 56 of, e.g., a 100 nm-thickness is formed on the entire surface by, e.g., CVD (see FIG. 4A). The polysilicon film 56 may be formed by forming amorphous silicon film and crystallizing the amorphous silicon film by thermal processing.

Figure 4B:
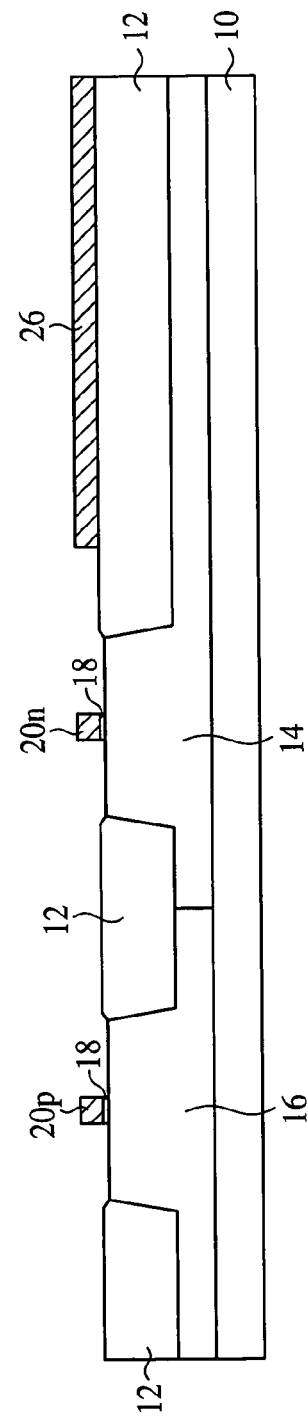

Then, the polysilcon film 56 is patterned by photolithography and dry etching to form the gate electrode 20n of the polysilicon film 56 in the region for the N type MOS transistor to be formed in, the gate electrode 20p of the polysilicon film 56 in the region for the P type MOS transistor to be formed in, and the resistance element 26 having the heat radiation part 26c and formed of the polysilicon film 56 in the region for the resistance element to be formed in on the device isolation insulation film 12 (see FIG. 4B).

Figure 4C:
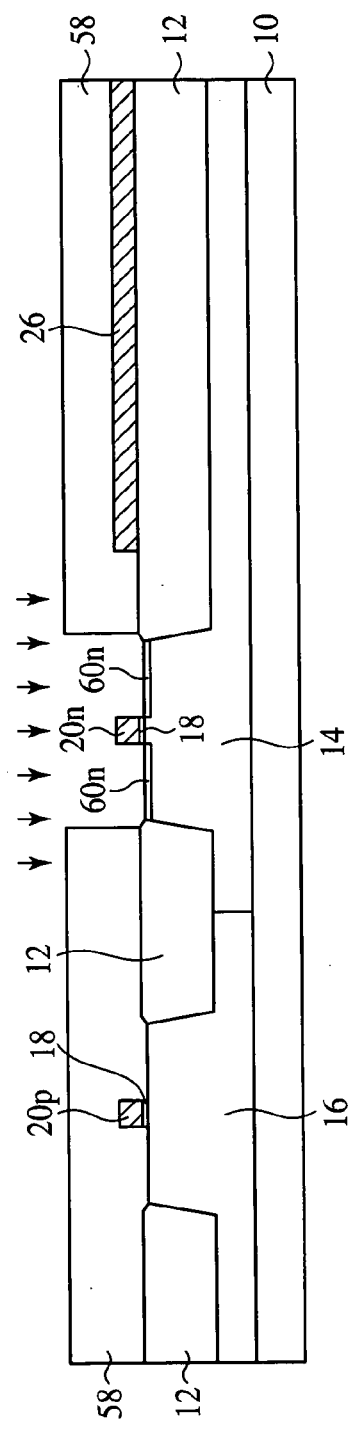

Then, a resist film 58 having an opening for exposing the region for the N type MOS transistor to be formed in is formed, and with the resist film 58 and the gate electrode 20n as the mask, arsenic (As) ions, for example, are implanted into the region for the N type MOS transistor to be formed in to form impurity diffused regions 60n to be the extension regions of the extension source/drain structure in the silicon substrate 10 on both sides of the gate electrode 20n (see FIG. 4C). After the impurity diffused regions 60n have been formed, the resist film 58 used as the mask is removed.

Similarly, a resist film 62 having an opening for exposing the region for the P type MOS transistor to be formed in is formed, and with the resist film 62 and the gate electrode 20p as the mask, boron (B) ions, for example, are implanted in the region for the P type MOS transistor to be formed in to form impurity diffused regions 60p to be the extension regions of the extension source/drain structure in the silicon substrate 10 on both sides of the gate electrode 20p (see FIG. 5A). After the impurity diffused regions 60p have been formed, the resist film 62 used as the mask is removed.

Then, a resist film 64 having an opening for exposing the resistor part 26a of the resistance element 26 is formed, and with the resist film 64 as the mask, boron ions as an impurity are implanted into the polysilicon film of the resistor part 26a (see FIG. 5B). The resistance value of the resistance element 26 formed together with the CMOS transistor is thus adjusted. The kind, the dose, etc. of the impurity to be implanted into the resistor part 26a, and conditions for the ion implantation are suitably set to thereby set the resistance value of the resistance element 26 at a desired value. The impurity may be implanted into the polysilicon film of the contact parts 26b by the ion implantation using a resist film having openings for exposing the resistor part 26a and the contact parts 26b as the mask.

Then, a silicon oxide film 66 of, e.g., a 100 nm-thickness is formed on the entire surface by, e.g., CVD (see FIG. 5C).

Then, a resist film 68 is formed on the entire surface by, e.g., spin coating. Then, the resist film 68 is patterned by photolithography to be thereby left, covering the silicon oxide film 66 on the resistor part 26a of the resistance element 26 (see FIG. 6A).

Next, the silicon oxide film 66 is anisotropically etched by, e.g., RIE with the resist film 68 as the mask. Thus, the sidewall spacers 22 of the silicon oxide film 66 are formed o the side walls of the gate electrodes 20n, 20p. On the other hand, the silicon oxide film 66 on the resistor part 26a of the resistance element 26, which is masked with the resist film 68 remains on the resistor part 26a, and the surfaces of the contact parts 26b and the heat radiation part 26c are exposed (see FIG. 6B). After the anisotropic etching of the silicon oxide film 66 has been completed, the resist film 68 used as the etching mask is removed.

Figure 6A:
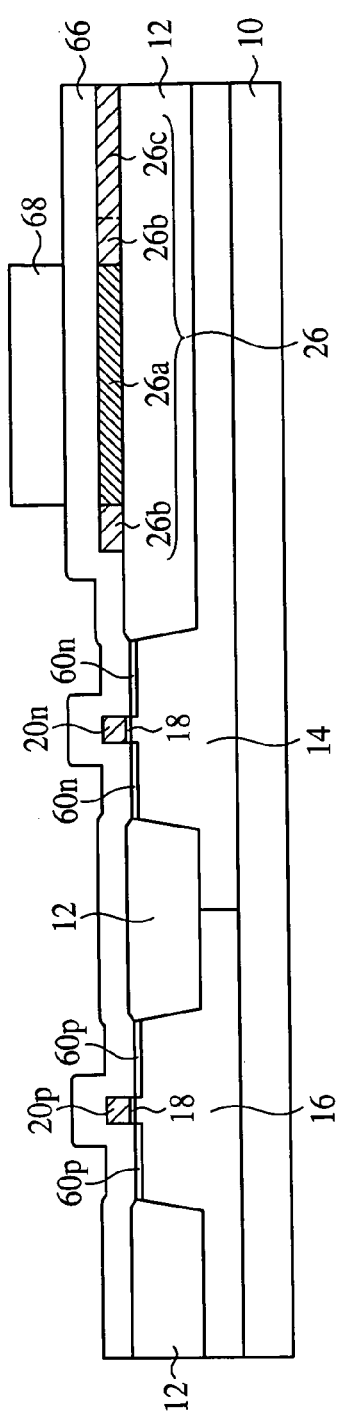
FIGS. 6A–6C are sectional views of the semiconductor device according to the first embodiment of the present invention in the step of the method for fabricating the same, which illustrate the method (Part 4).
Figure 6B:
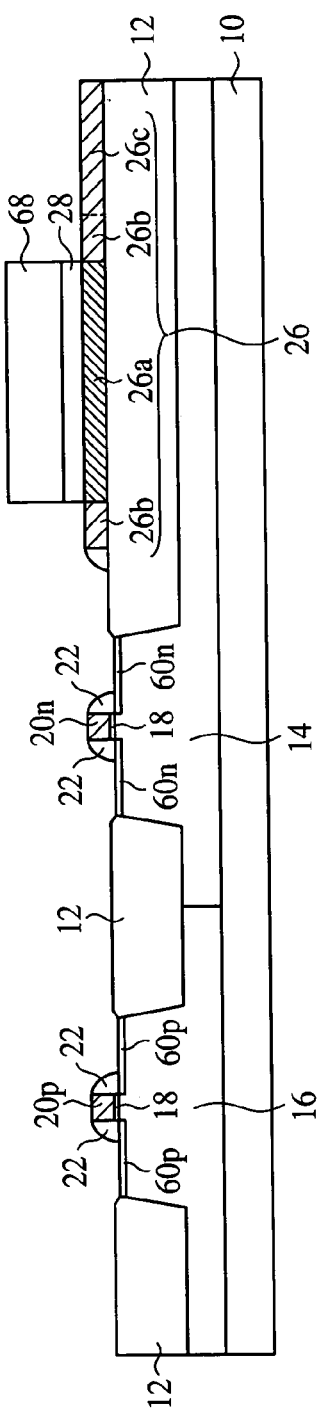
Figure 6C:
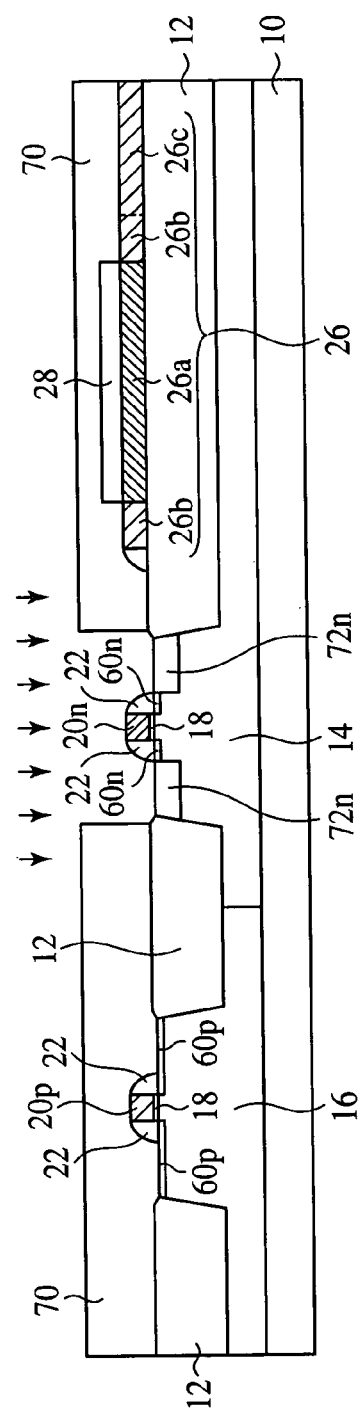

Then, a resist film 70 having an opening for exposing the region for the N type MOS transistor to be formed in is formed, and with the resist film 70, the gate electrode 20n and the sidewall spacer 22 as the mask, arsenic ions are implanted into the region for the N type MOS transistor to be formed in to form the heavily doped source/drain impurity regions 72n in the silicon substrate 10 on both sides of the gate electrode 20n and the sidewall spacer 22 (see FIG. 6C). After the source/drain impurity regions 72n have been formed, the resist film 70 used as the mask is removed.

Similarly, a resist film 74 having an opening for exposing the region for the P type MOS transistor to be formed in and an opening for exposing the region of the resistance element 26 except the heat radiation part 26c is formed, and with the resist film 74, the gate electrode 20p, the sidewall spacer 22 and the insulation film 28 on the resistor part 26a as the mask, boron fluoride ($BF_2$) ions, for example, are implanted into the region for the P type MOS transistor to be formed in to form the heavily doped source/drain impurity regions 72p in the silicon substrate 10 on both sides of the gate electrode 20p and the sidewall spacer 22 (see FIG. 7A). Concurrently therewith, the boron fluoride ions are implanted into the contact parts 26b of the resistance element 26, and the contact part 26b is heavily doped.

After the source/drain impurity regions 72p have been formed, the resist film 74 used as the mask is removed.

Then, prescribed thermal processing is made to activate the implanted impurities to form the N-type source/drain diffused layer 24n of the extension source/drain structure in the silicon substrate 10 on both sides of the gate electrode 20n, and the P-type source/drain diffused layer 24p of the extension source/drain structure in the silicon substrate 10 on both sides of the gate electrode 20p (see FIG. 7B).

Next, a silicon oxide film of, e.g., a 600 nm-thickness is deposited on the entire surface by, e.g., CVD, and then the silicon oxide film is flattened by, e.g., CMP to form the inter-layer insulation film 30 of the silicon oxide film having the flattened surface (see FIG. 7C).

Figure 8A:
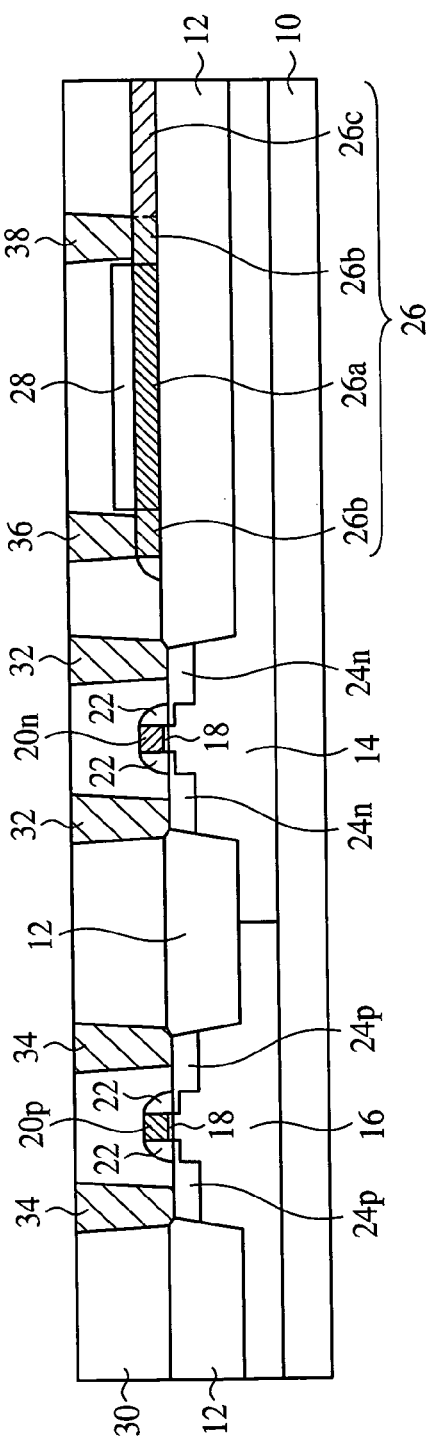
FIGS. 8A and 8B are sectional views of the semiconductor device according to the first embodiment of the present invention in the step of the method for fabricating the same, which illustrate the method (Part 6).

Then, contact holes are formed in the inter-layer insulation film 30 by photolithography and dry etching, and a barrier metal and a conduction film, such as tungsten film or others, are suitably buried in the contact holes to thereby form the contact plugs 32 electrically connected to the source/drain diffused layer 24n of the N type MOS transistor, the contact plugs 34 electrically connected to the source/drain diffused layer 24p of the P type MOS transistor, the contact plugs (not illustrated) electrically connected respectively to the gate electrodes 20n, 20p, and the contact plugs 36, 38 electrically connected respectively to the contact parts 26b on both sides of the resistor part 26a of the resistance element 26 (see FIG. 8A). It is possible that ions are implanted into the contact parts 26b of the resistance element 26 after the contact holes have been formed to thereby make the contact resistance with the contact plugs low.

Figure 8B:
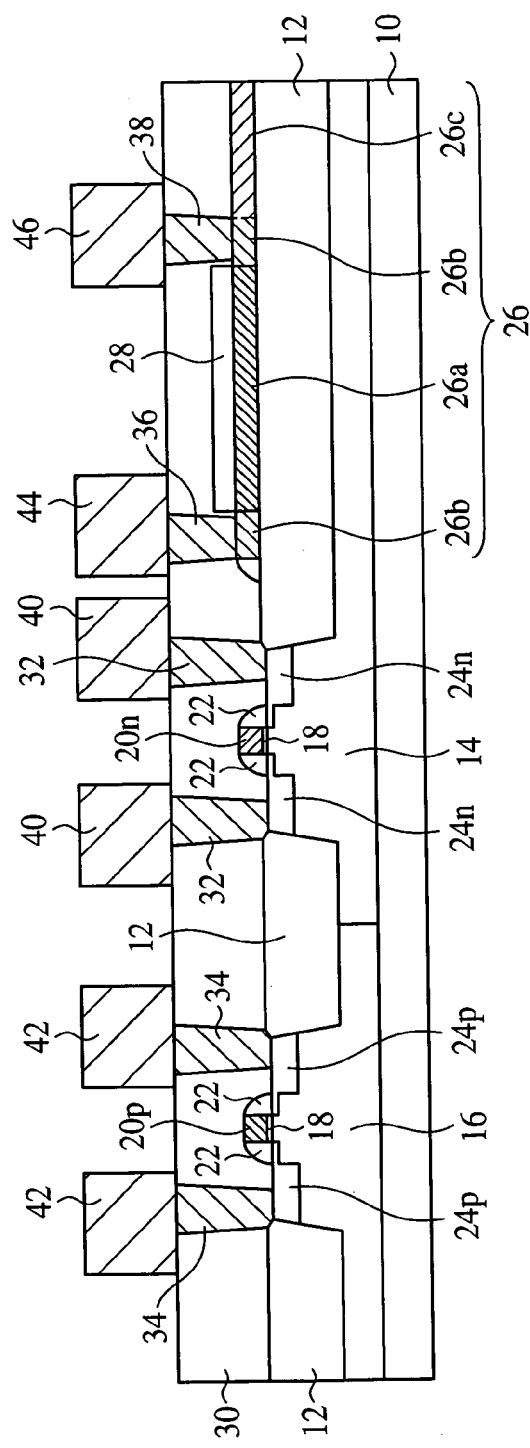

Then, a conduction film is formed on the entire surface by, e.g., CVD and is suitably patterned to thereby form the interconnection layers 40 electrically connected to the source/drain diffused layers 24n of the N type MOS transistor via the contact plugs 32, the interconnection layers 42 electrically connected to the source/drain diffused layers 24p of the P type MOS transistor via the contact plugs 34, interconnection layers (not illustrated) electrically connected respectively to the gate electrodes 20n, 20p via the contact plugs, and interconnection layers 44, 46 electrically connected respectively to the contact parts 26b on both sides of the resistor part 26a of the resistance element 26 via the contact plugs 36, 38 (see FIG. 8B).

Thus, the semiconductor device according to the present embodiment comprising the N type MOS transistor and the P type MOS transistor forming the CMOS transistor, and the resistance element 26 of polysilicon is fabricated.

As described above, according to the present embodiment, the resistance element 26 includes the heat radiation part 26c of high heat radiation and having a larger area in comparison with the resistor part 26a functioning as the resistor provided at the part where the heat radiation part 26c causes no disadvantage in terms of the circuit constitution even under the presence of a parasitic capacitance, whereby the semiconductor device comprising the resistance element 26 having a small parasitic capacitance and good heat radiation can be provided.

(A Second Embodiment)

Figure 9:
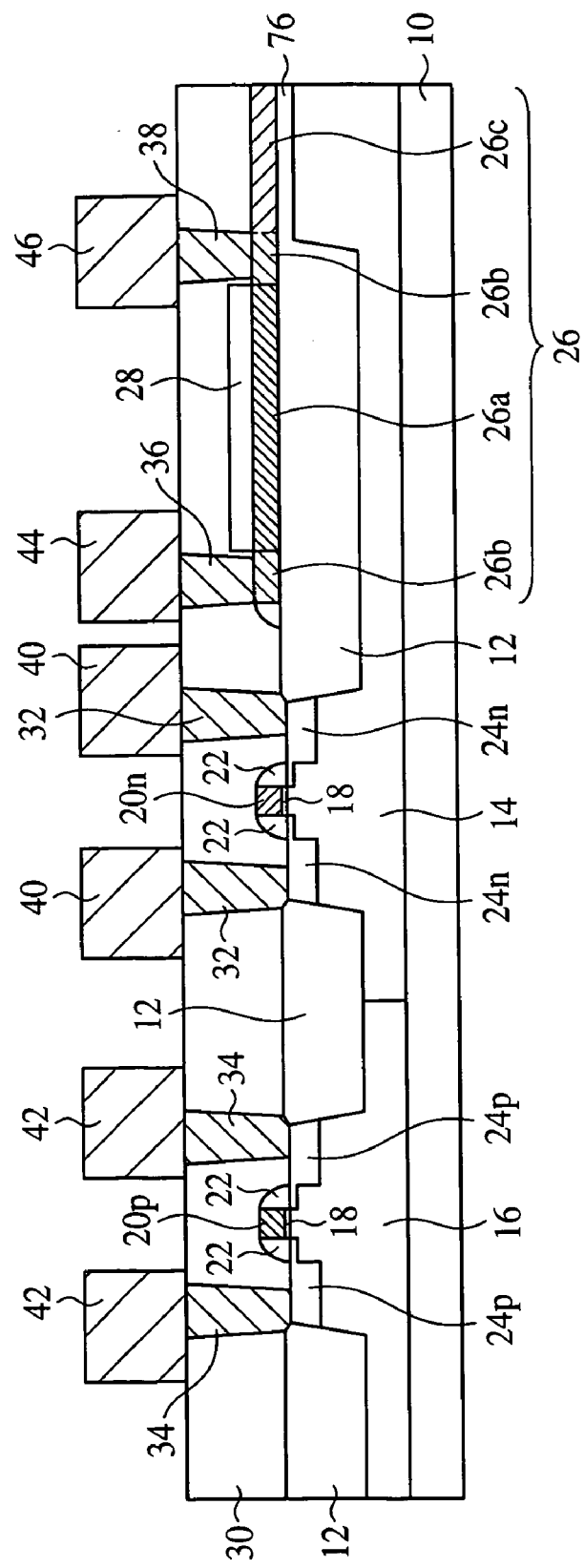
FIG. 9 is a sectional view of the semiconductor device according to a second embodiment of the present invention, which illustrates a structure thereof.

The semiconductor device and the method for fabricating the same according to a second embodiment of the present invention will be explained with reference to FIGS. 9 to 10C. FIG. 9 is a sectional view of the semiconductor device according to the present embodiment, which illustrates a structure thereof. FIGS. 10A–10C are sectional views of the semiconductor device according to the present embodiment in the steps of the method for fabricating the same, which illustrate the method. The same members of the present embodiment as those of the semiconductor device according to the first embodiment are represented by the same reference numbers not to repeat or to simplify their explanation.

First, the structure of the semiconductor device according to the present embodiment will be explained with reference to FIG. 9.

The basic structure of the semiconductor device according to the present embodiment is substantially the same as that of the semiconductor device according to the first embodiment. The semiconductor device according to the present embodiment is different from the semiconductor device according to the first embodiment in that in the former the insulation film formed below the radiation part 26 of the resistance element 26 is thinner than the insulation film formed below the resistor part 26a thereof.

That is, as illustrated in FIG. 9, an insulation film 76 thinner than a device isolation insulation film 12 on which the resistor part 26a is formed is formed below the heat radiation part 26c of the resistance element 26. The thinner insulation film 76 is, e.g., a gate insulation film formed on, e.g., a device region.

The heat radiation part 26c may be wider and has a larger area than the resistor part 26a, as in the semiconductor device according to the first embodiment or may have a substantially the same width or may have a smaller area than the resistor part 26a.

As described above, the semiconductor device according to the present embodiment is characterized mainly in that the insulation film 76 below the heat radiation part 26c formed at the part where the heat radiation part 26c causes no disadvantage in terms of the circuit constitution even under the presence of a parasitic capacitance is thinner than the device isolation insulation film 12 on which the resistor part 26a is formed.

The heat radiation part 26c formed on the thin insulation film 76 is near the silicon substrate 10. This permits the Joule heat generated in the resistor part 26a of the resistance element 26 to efficiently escape into the silicon substrate 10 via the heat radiation part 26c, and good heat radiation can be realized.

Next, the method for fabricating the semiconductor device according to the present embodiment will be explained with reference to FIGS. 10A–10C.

Figure 10A:
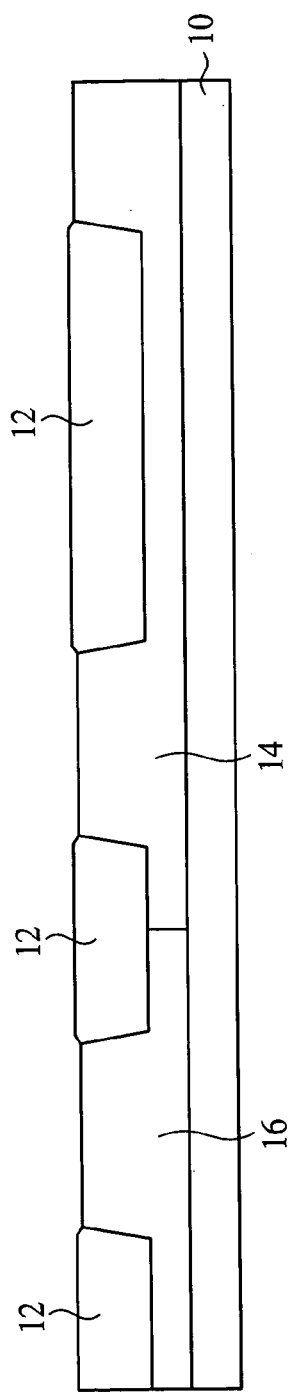
FIGS. 10A–10C are sectional views of the semiconductor device according to the second embodiment of the present invention in the steps of the method for fabricating the same, which illustrate the method.
Figure 10B:
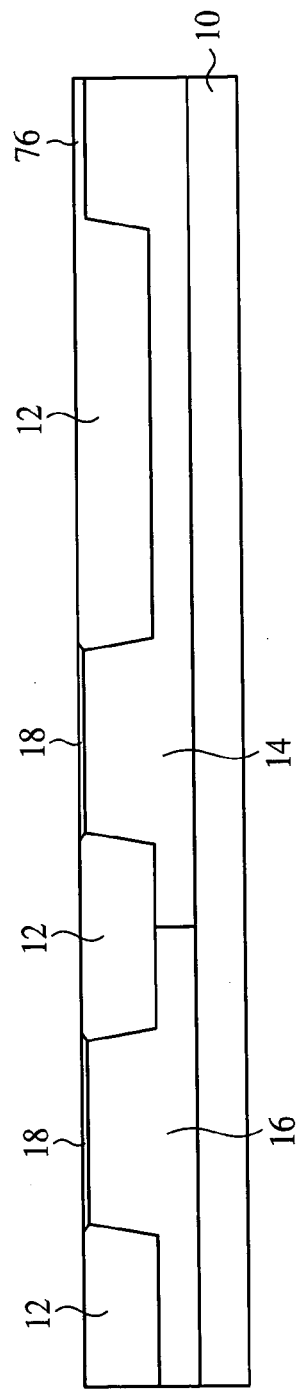
Figure 10C:
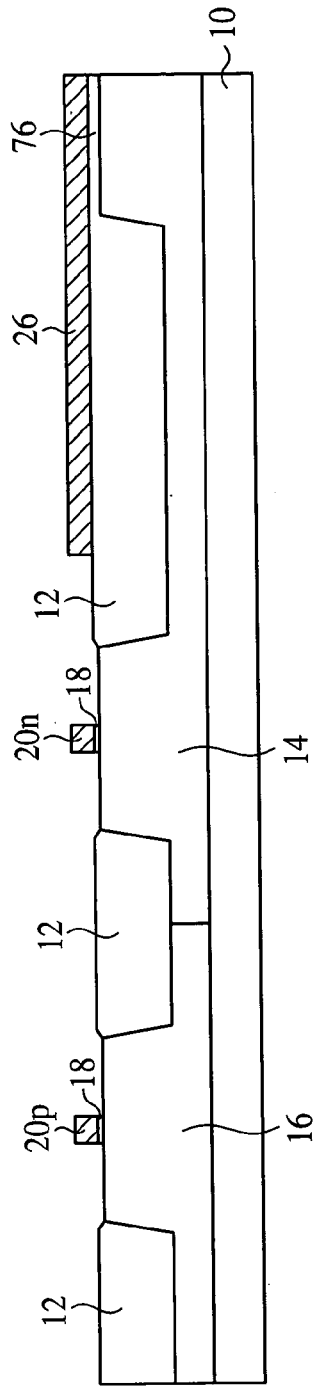

First, in substantially the same way as in the method for fabricating the semiconductor device according to the first embodiment, the device isolation insulation film 12 is formed to define the device regions in the silicon substrate 10, and a P well 14 and an N well 16 are formed in the silicon substrate (see FIG. 10A).

Then, the surface of the silicon substrate 10 is thermally oxidized by, e.g., thermal oxidation to form gate insulation film 18 of silicon oxide film on the device regions in the N type MOS transistor to be formed in and the P type MOS transistor to be formed in. At this time, the insulation film 76 of the gate insulation film 18 on which the heat radiation part 26c of the resistance element 26 is to be formed is formed on the device region in the region for the resistance element to be formed in (see FIG. 10B). It is possible that independently of forming the gate insulation film 18 by thermal oxidation, a silicon oxide film or a silicon oxynitride film, etc. is formed to form the insulation film 76, on which the heat radiation part 26c is to be formed, on the device region in the region for the resistance element to be formed in.

Then, a polysilicon film is formed on the entire surface by, e.g., CVD. Then, the polysilicon film is patterned by photolithography and dry etching to form the gate electrode 20n of the polysilicon film in the region for the N type MOS transistor to be formed in, the gate electrode 20p of the polysilicon film in the region for the P type MOS transistor to be formed in, and the resistance element 26 having the heat radiation part 26c of the polysilicon film on the device isolation insulation film 12 and the thin insulation film 76 in the region for the resistance element to be formed in (see FIG. 10C). At this time, the polysilicon film is patterned so that the heat radiation part 26c of the resistance element 26 is formed on the thin insulation film 76.

Hereafter, in the same way as in the method for fabricating the semiconductor device according to the first embodiment illustrated in FIG. 4C and FIGS. 5A to 8B, the semiconductor device according to the present embodiment illustrated in FIG. 9 is fabricated.

As described above, according to the present embodiment, the resistance element 26 comprises the heat radiation part 26c formed on the insulation film 76 thinner than the device isolation insulation film 12 on which the resistor part 26a functioning as the resistor in the part where the heat radiation part 26c causes no disadvantage in terms of the circuit constitution even under the presence of a parasitic capacitance, whereby the semiconductor device comprising the resistance element 26 having a small parasitic capacitance and good heat radiation can be provided.

(A Third Embodiment)

Figure 11:
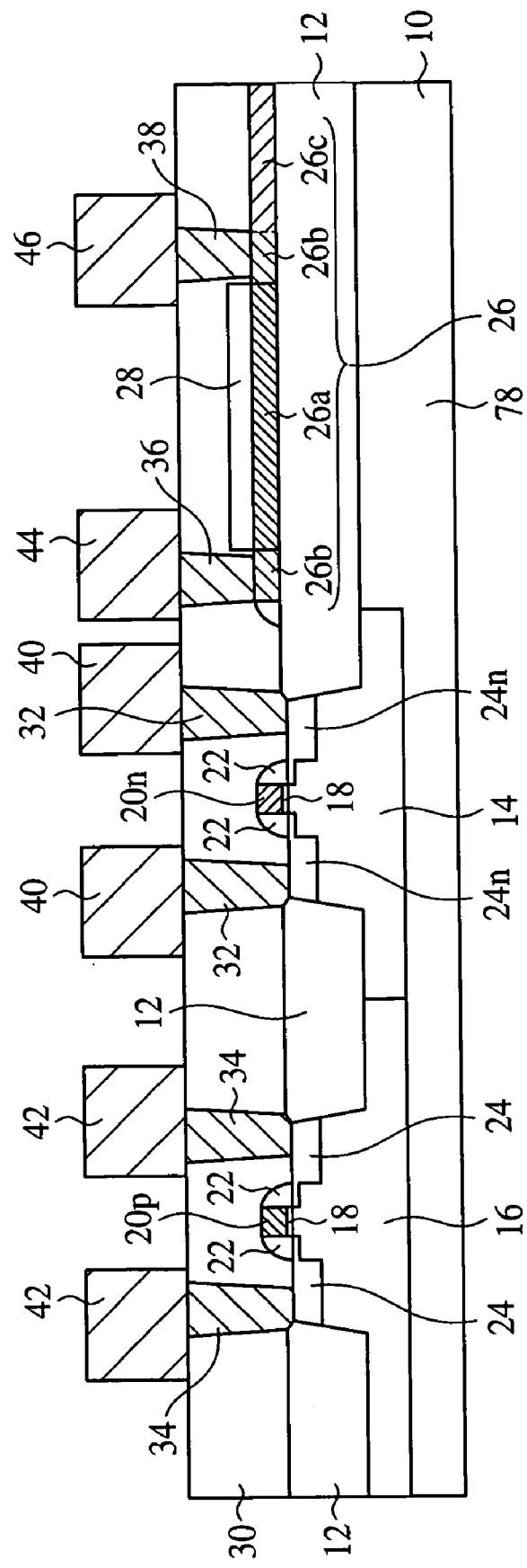
FIG. 11 is a sectional view of the semiconductor device according to a third embodiment of the present invention, which illustrates a structure thereof.

The semiconductor device according to a third embodiment of the present invention will be explained with reference to FIG. 11. FIG. 11 is a sectional view of the semiconductor device according to the present embodiment, which illustrates a structure thereof. The same members of the present embodiment as those of the semiconductor device according to the first embodiment are represented by the same reference numbers not to repeat or to simplify their explanation.

The basic structure of the semiconductor device according to the present embodiment is substantially the same as that of the semiconductor device according to the first embodiment. The semiconductor device according to the present embodiment is different from the semiconductor device according to the first embodiment in that in the former the silicon substrate 10 has a lower impurity concentration in the region for the resistance element 26 formed in than in the regions for the P well and the N well formed in, where the well-forming ion implantation has been conducted.

That is, as illustrated in FIG. 11, the silicon substrate 10 in the region for the resistance element 26 formed in is a non-well-forming ion implanted part 78, where no well-forming ion implantation has been conducted.

The impurity concentration of the non-well forming ion implanted part 78 of the silicon substrate 10 is the same as the impurity concentration of the silicon substrate 10 itself. Generally, the impurity concentration of the silicon substrate used in semiconductor devices is, e.g., $1 \times 10^{15}$–$1 \times 10^{16}$/cm$^3$. In contrast to this, the impurity concentration of the P well 14 and the N well 16 is, e.g., $1 \times 10^{17}$–$1 \times 10^{18}$/cm$^3$ and is 10–100 times that of the non-well-forming ion implanted part 78.

As described above, the semiconductor device according to the present embodiment is characterized mainly in that the ion implantation has not conducted in the silicon substrate 10 in the region where the resistance element 26 is formed, and the region is the non-well forming ion implanted part 78 whose impurity concentration is lower. As described above, no impurity is intentionally implanted in the silicon substrate 10 in the region where the resistance element 26 is to be formed to make the impurity concentration there lower, whereby the depletion layer is extended toward the silicon substrate 10 under the resistance element 26. Resultantly, the parasitic capacitance generated between the resistance element 26 and the silicon substrate 10 is decreased.

The distance between the resistance element 26 and the silicon substrate 10 is not changed by the absence and presence of the well-forming ion implantation. Accordingly, the absence of the well-forming ion implantation never influences the radiation of the Joule heat generated in the resistance element 26.

Figure 12:
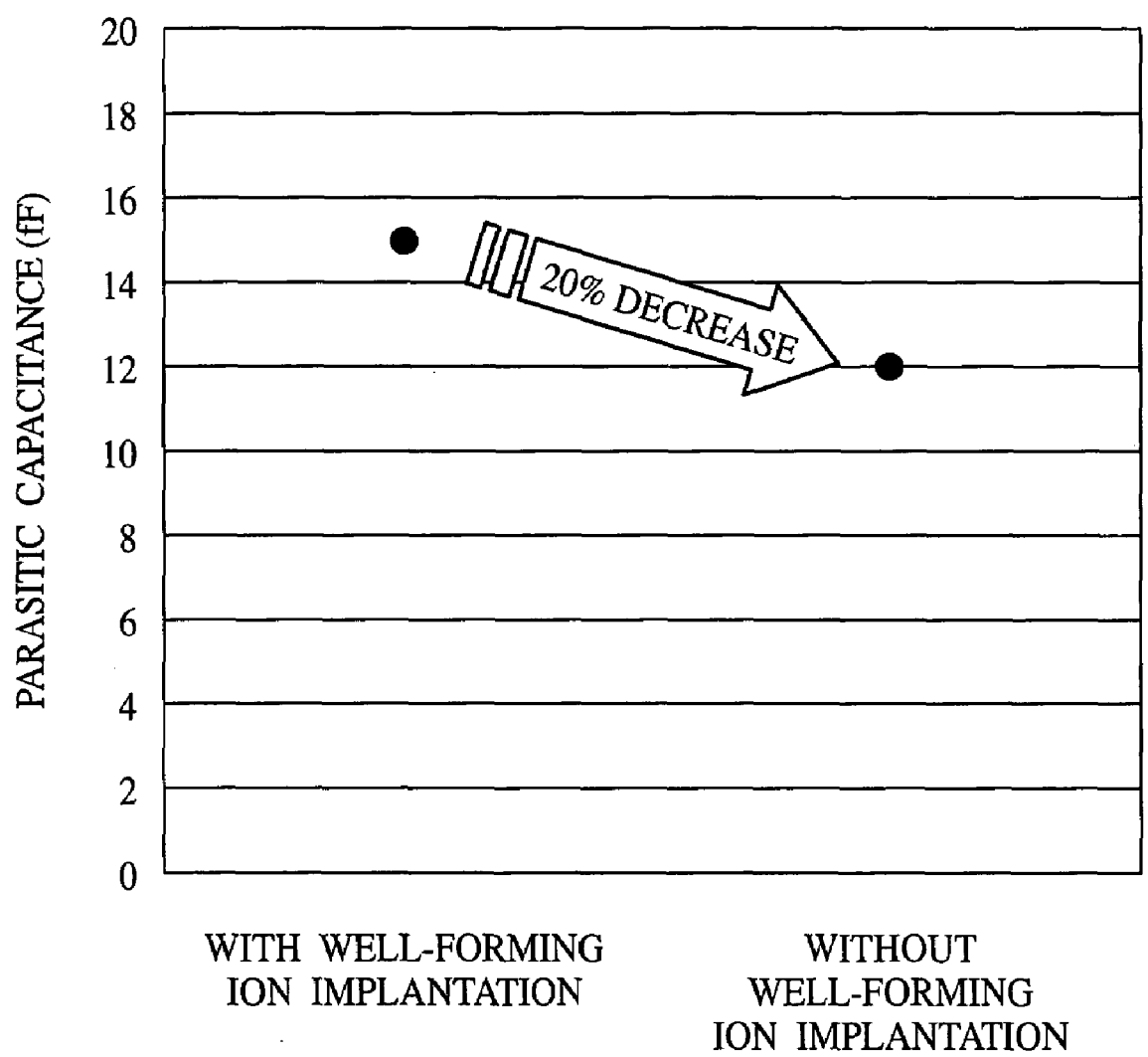
FIG. 12 is a graph of the effect of decreasing the parasitic capacitance by the semiconductor device according to the third embodiment of the present invention.

FIG. 12 is a graph of the result of one example that the parasitic capacitances generated between the resistance element 26 and the silicon substrate 10 were measured on the semiconductor device with the well-forming ion implanted conducted also in the silicon substrate in the region where the resistance element 26 is formed and the semiconductor device according to the present embodiment. As evident in the graph, the semiconductor device according to the present embodiment without the well-forming ion implantation conducted in the silicon substrate 10 in the region where the resistance element 26 formed has the parasitic capacitance decreased by about 20% in comparison with the semiconductor device with the well-forming ion implantation conducted.

The semiconductor device according to the present embodiment can be fabricated by the method for fabricating the semiconductor device according to the first embodiment in which the region for the resistance element to be formed in is masked with a resist film when the well-forming ion implantation is conducted.

As described above, according to the present embodiment, the silicon substrate 10 in the region where the resistance element 26 is formed is the non-well forming ion implanted part 78 where no well-forming ion implantation has been conducted and the impurity concentration is lower, whereby the semiconductor device can decrease the parasitic capacitance generated between the resistance element 26 and the silicon substrate 10 without influencing the radiation of the Joule heat generated in the resistance element 26.

(Modifications)

The semiconductor device according to the present embodiment is the semiconductor device according to the first embodiment having the silicon substrate 10 in the region where the resistance element 26 formed as the non-well-forming ion implanted part 78 whose impurity concentration is made lower without the well-forming ion implantation but is not essentially the semiconductor device according to the first embodiment.

Figure 13:
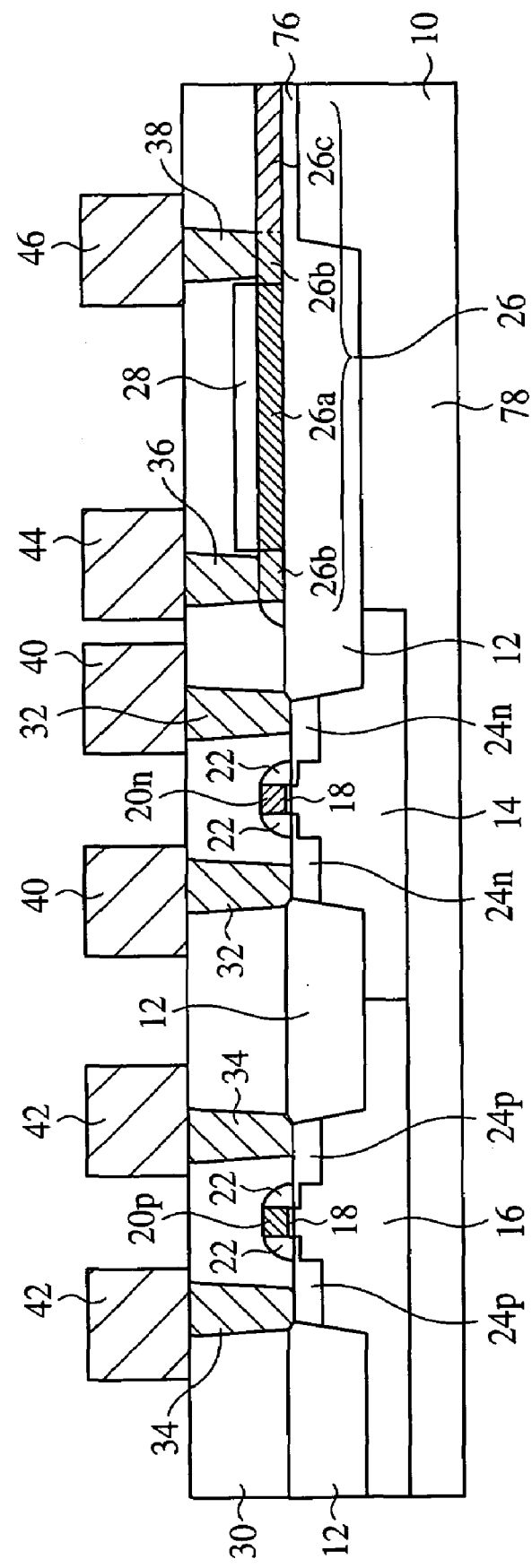
FIG. 13 is a sectional view of the semiconductor device according to a modification (Modification 1) of the third embodiment of the present invention, which illustrates a structure thereof.

As exemplified in FIG. 13, the semiconductor device according to the second embodiment having the heat radiation part 26c of the resistance element 28 formed on the thin insulation film 76 may have the silicon substrate 10 in the region where the resistance element 26 is formed as the non-well forming ion implanted part 78.

Figure 14:
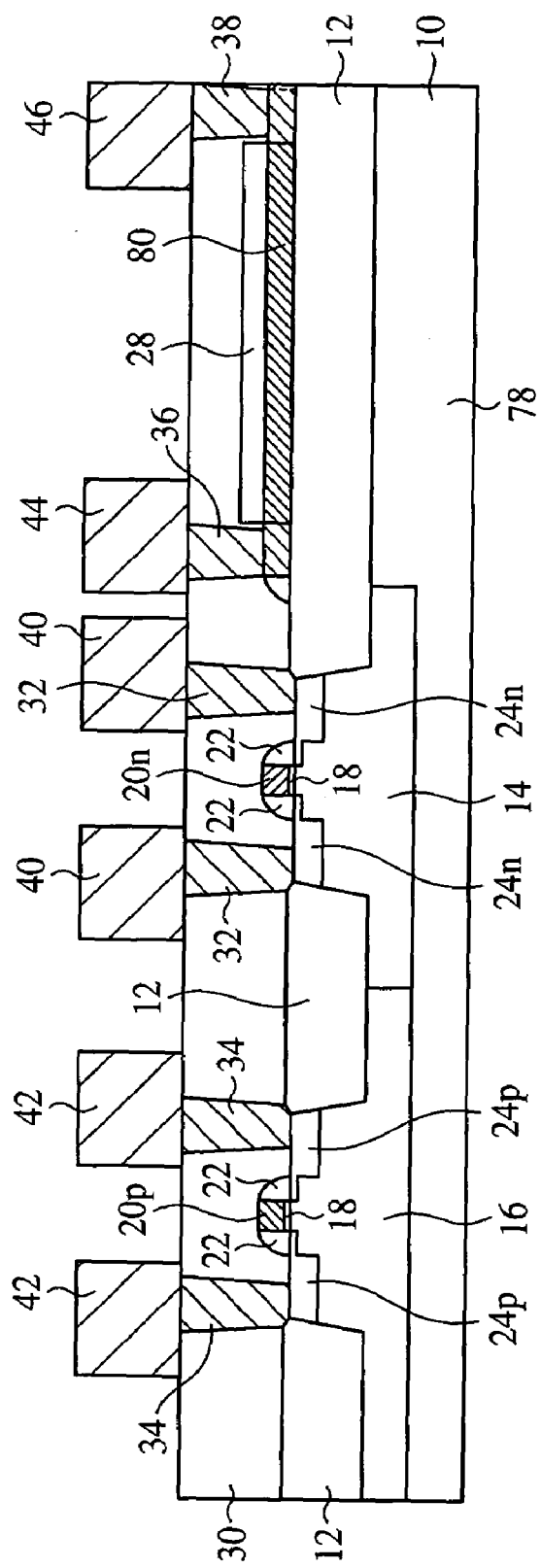
FIG. 14 is a sectional view of the semiconductor device according to a modification (Modification 2) of the third embodiment of the present invention, which illustrates a structure thereof.
Figure 15:
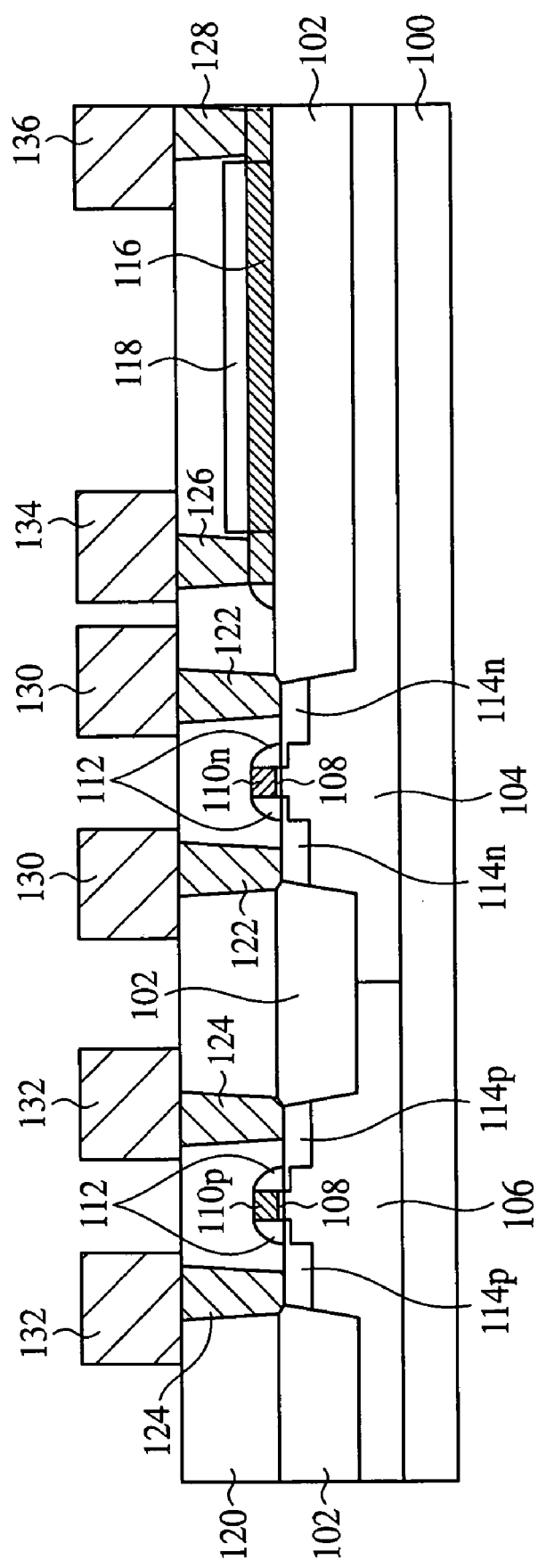
FIG. 15 is a sectional view of the conventional semiconductor device comprising a CMOS transistor and a resistance element of polysilicon film, which illustrates a structure thereof.

As exemplified in FIG. 14, a semiconductor device including the resistance element 80 without the heat radiation part 26c may have the silicon substrate 10 in the region where the resistance element 80 is formed as the non-well forming-ion implanted part 78.

In the modifications illustrated in FIGS. 13 and 14 as well, because of the non-well forming ion implanted part 78, the depletion layer is extended below the resistance element 16 toward the silicon substrate 10, whereby the parasitic capacitance generated between the resistance elements 26, 80 and the silicon substrate 10 can be decreased without influencing the radiation of the Joule heat in the resistance elements 26, 80.

(Modified Embodiments)

The present invention is not limited to the above-described embodiments and can cover other various modifications.

For example, in the above-described embodiments, the resistance element 26 is formed with the N type MOS transistor and the P type MOS transistor. However, the semiconductor devices to be formed with the resistance element 26 are not limited to them.

In the above-described embodiments, the resistance element 26 is formed on the device isolation insulation film 12, etc. However, the resistance element 26 is not formed essentially on the device isolation insulation film 12, etc. and can be formed on various insulation films.

The above-described embodiments are explained by means of the differential pair circuit. Circuits formed by using the semiconductor device according to the present invention are not limited to the differential part circuit.

In the above-described embodiments, the resistance element 26 has the heat radiation part 26c on one of the contact parts 26b formed on both sides of the resistor part 216a. Depending on a circuit constitution, etc. using the resistance element 26, the resistance element 26 may have the heat radiation parts 26c provided on the respective contact parts 26b formed on both sides of the resistance part 26a.

In the above-described embodiments, the differential pair circuit has the contact part 26b, which the heat radiation part 26c is formed on, electrically connected to the power source line for applying the source voltage. However, what is the heat radiation part 26c is connected to is not essentially the power source line and may be connected to any line which applies a fixed potential, such as a ground potential line, or others.

In the above-described embodiments, the contact plugs are connected directly to the source/drain diffused layer, the gate electrodes and the contact part of the resistance element. It is possible to form a silicide film, such as $CoSi_2$ film or others, on the surfaces of them by salicide process, and the contact plugs are connected to the silicide film, which can further decrease the contact resistance.

INDUSTRIAL APPLICABILITY

The present invention comprises the resistance element of polysilicon film formed over the semiconductor substrate, which has the resistor part whose resistance value set at a prescribed value, the contact part formed on the side of the resistor part and connected to the line for applying a fixed potential, and the heat radiation part connected to the contact part, whereby the resistance element can have a small parasitic capacitance and has good heat radiation, and thus is useful to improve the operation speed and reliability of the semiconductor device.

The invention claimed is:

1. A semiconductor device comprising a resistance element of a polysilicon film formed over a semiconductor substrate,
    the resistance element including a resistor part having a resistance value set at a prescribed value, a contact part formed on an end of the resistor part and connected to a line for applying a fixed potential, and a heat radiation part connected to the contact part.

2. A semiconductor device according to claim 1, wherein,
    the resistance element is a load resistance of a differential pair circuit, and
    the contact part is connected to a power source line for applying a source voltage to the differential pair circuit or a ground potential line.

3. A semiconductor device according to claim 2, further comprising
    an insulation film formed between the semiconductor substrate and the resistance element.

4. A semiconductor device according to claim 3, wherein
    the insulation film includes a first insulation film formed between the semiconductor substrate and the resistor part, and a second insulation film which is formed between the semiconductor substrate and the heat radiation part and is thinner than the first insulation film.

5. A semiconductor device according to claim 4, wherein
    the first insulation film is a device isolation insulation film for defining a device region in the semiconductor substrate, and
    the second insulation film is an insulation film formed on the device region.

6. A semiconductor device according to claim 2, wherein an impurity concentration of the semiconductor substrate in a region where the resistance element is formed is $1\times10^{15}$–$1\times10^{16}$/cm$^3$.

7. A semiconductor device according to claim 2, wherein an impurity concentration of the heat radiation part is lower than an impurity concentration of the resistor part.

8. A semiconductor device according to claim 2, wherein the heat radiation part has a larger area than the resistance part.

9. A semiconductor device according to claim 2, wherein the heat radiation part is wider than the resistor part and the contact part.

10. A semiconductor device according to claim 2, further comprising
    a gate electrode formed over the semiconductor substrate with a gate insulation film formed therebetween and including a polysilicon film of the same layer as the polysilicon film forming the resistance element.

11. A semiconductor device according to claim 1, further comprising
    an insulation film formed between the semiconductor substrate and the resistance element.

12. A semiconductor device according to claim 11, wherein
    the insulation film includes a first insulation film formed between the semiconductor substrate and the resistor part, and a second insulation film which is formed between the semiconductor substrate and the heat radiation part and is thinner than the first insulation film.

13. A semiconductor device according to claim 12, wherein
    the first insulation film is a device isolation insulation film for defining a device region in the semiconductor substrate, and
    the second insulation film is an insulation film formed on the device region.

14. A semiconductor device according to claim 1, wherein an impurity concentration of the semiconductor substrate in a region where the resistance element is formed is $1\times10^{15}$–$1\times10^{16}$/cm$^3$.

15. A semiconductor device according to claim 1, wherein an impurity concentration of the heat radiation part is lower than an impurity concentration of the resistor part.

16. A semiconductor device according to claim 1, wherein the heat radiation part has a larger area than the resistance part.

17. A semiconductor device according to claim 1, wherein the heat radiation part is wider than the resistor part and the contact part.

18. A semiconductor device according to claim 17, wherein
    the resistor part and the contact part have substantially the same width.

19. A semiconductor device according to claim 17, wherein
    the heat radiation part has a rectangular plane shape.

20. A semiconductor device according to claim 1, further comprising
    a gate electrode formed over the semiconductor substrate with a gate insulation film formed therebetween and including a polysilicon film of the same layer as the polysilicon film forming the resistance element.

* * * * *